(12) United States Patent
Wakuda

(10) Patent No.: US 11,435,832 B2
(45) Date of Patent: Sep. 6, 2022

(54) INPUT DEVICE, CONTROL METHOD, AND NON-TRANSITORY RECORDING MEDIUM

(71) Applicant: ALPS ALPINE CO., LTD., Tokyo (JP)

(72) Inventor: Hiroshi Wakuda, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 17/179,798

(22) Filed: Feb. 19, 2021

(65) Prior Publication Data
US 2021/0173488 A1    Jun. 10, 2021

Related U.S. Application Data

(63) Continuation of application No. PCT/JP2019/009123, filed on Mar. 7, 2019.

(30) Foreign Application Priority Data

Aug. 29, 2018 (JP) .............................. JP2018-160750

(51) Int. Cl.
*G06F 3/01*    (2006.01)
*G06F 3/0354*    (2013.01)
(Continued)

(52) U.S. Cl.
CPC .......... *G06F 3/016* (2013.01); *G06F 3/03547* (2013.01); *G06F 3/0416* (2013.01); *G06F 3/0421* (2013.01); *G06F 3/0428* (2013.01)

(58) Field of Classification Search
CPC ......... H01L 41/09; H01L 41/12; H01L 41/47; B06B 1/06; B06B 1/08
See application file for complete search history.

(56) References Cited

U.S. PATENT DOCUMENTS

| 2010/0231367 A1 | 9/2010 | Cruz-Hernandez et al. |
| 2010/0231539 A1 | 9/2010 | Cruz-Hernandez et al. |

(Continued)

FOREIGN PATENT DOCUMENTS

| JP | S62-147521 | 7/1987 |
| JP | 2010-140492 | 6/2010 |

(Continued)

OTHER PUBLICATIONS

International Search Report for PCT/JP2019/009123 dated May 14, 2019.

(Continued)

*Primary Examiner* — Ryan A Lubit
(74) *Attorney, Agent, or Firm* — IPUSA, PLLC

(57) ABSTRACT

An input device includes an operation member, an actuator configured to impart a tactile effect to the operation member, and a controller configured to apply, to the actuator, a control signal for starting to apply a first vibration to the operation member at a first timing and for starting to apply a second vibration to the operation member at a second timing after the first timing, such that a combined vibration of the first vibration and the second vibration is applied to the operation member. The controller is configured to change a duration of a first period of the combined vibration to two or more different durations of the first period by changing a control period of time that extends from the first timing to the second timing to two or more different control periods of time.

20 Claims, 14 Drawing Sheets

(51) Int. Cl.
 *G06F 3/041* (2006.01)
 *G06F 3/042* (2006.01)

(56) References Cited

U.S. PATENT DOCUMENTS

| | | | |
|---|---|---|---|
| 2010/0231540 A1 | 9/2010 | Cruz-Hernandez et al. | |
| 2010/0231541 A1 | 9/2010 | Cruz-Hernandez et al. | |
| 2010/0231550 A1 | 9/2010 | Cruz-Hernandez et al. | |
| 2014/0145836 A1* | 5/2014 | Tossavainen | H04R 7/04 340/407.2 |
| 2015/0293592 A1* | 10/2015 | Cheong | G06F 1/163 345/173 |
| 2016/0063826 A1* | 3/2016 | Morrell | G08B 6/00 340/407.1 |
| 2016/0103491 A1 | 4/2016 | Taninaka et al. | |
| 2016/0313795 A1* | 10/2016 | Muramatsu | H01L 41/0986 |
| 2016/0320919 A1 | 11/2016 | Zhang | |
| 2017/0060245 A1 | 3/2017 | Kukimoto et al. | |
| 2017/0220197 A1* | 8/2017 | Matsumoto | G06F 3/016 |
| 2018/0059857 A1* | 3/2018 | Kumada | G06F 3/0234 |
| 2018/0229116 A1 | 8/2018 | Rihn et al. | |
| 2018/0301001 A1* | 10/2018 | Knott | G10L 15/22 |
| 2019/0091566 A1* | 3/2019 | Mahlmeister | A63F 13/213 |

FOREIGN PATENT DOCUMENTS

| | | |
|---|---|---|
| JP | 2017-049699 | 3/2017 |
| JP | 2017-129916 | 7/2017 |
| JP | 2017-208024 | 11/2017 |
| JP | 2017-532648 | 11/2017 |
| JP | 2018-110005 | 7/2018 |
| JP | 2018-129049 | 8/2018 |
| WO | 2013/186847 | 12/2013 |
| WO | 2014/207842 | 12/2014 |
| WO | 2015/092966 | 6/2015 |

OTHER PUBLICATIONS

Office Action dated Feb. 1, 2022 issued with respect to the corresponding Japanese Patent Application No. 2020-540032.

* cited by examiner

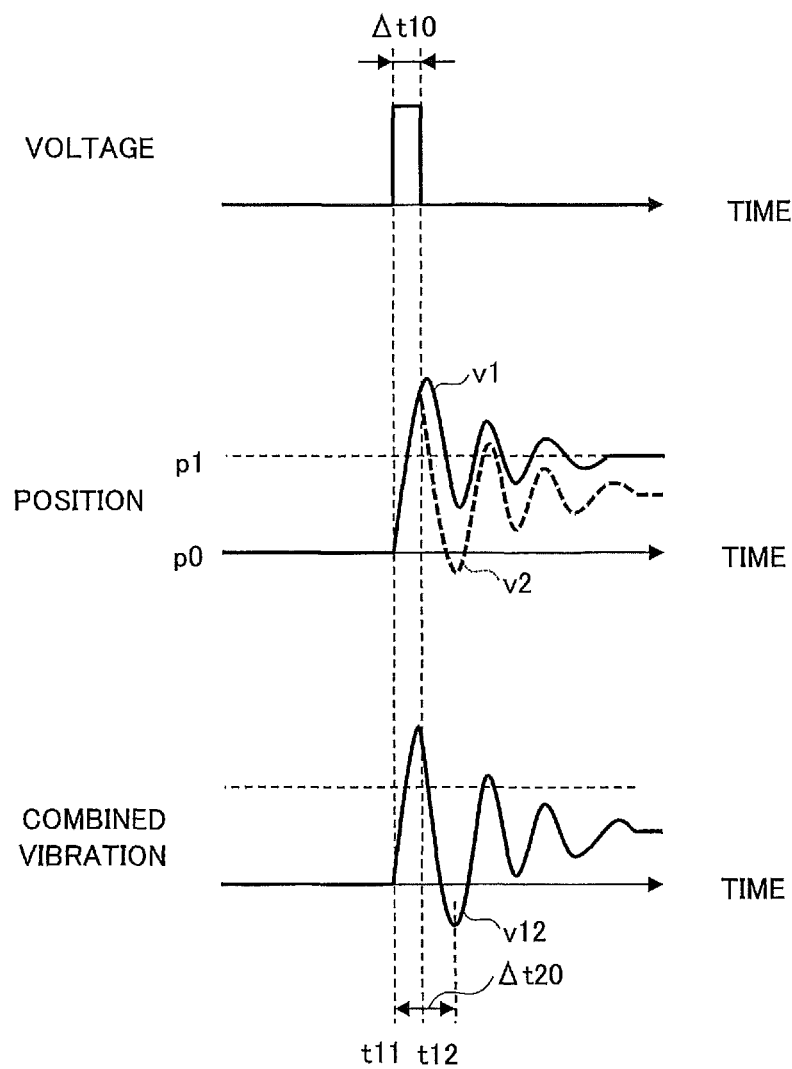

INPUT DEVICE, CONTROL METHOD, AND NON-TRANSITORY RECORDING MEDIUM

CROSS-REFERENCE TO RELATED APPLICATIONS

This application is a continuation of International Application No. PCT/JP2019/009123, filed on Mar. 7, 2019 and designating the U.S., which claims priority to Japanese Patent Application No. 2018-160750, filed on Aug. 29, 2018. The contents of these applications are incorporated herein by reference in their entirety.

BACKGROUND OF THE INVENTION

1. Field of the Invention

The disclosures herein relate to an input device, a control method, and a non-transitory recording medium.

2. Description of the Related Art

In recent years, input devices such as touchpads allowing operators to perform touch operations by touching operation surfaces have been widely used. Unlike the case of a switch device and a variable resistor, the operator is unable to feel a tactile sensation when operating such an input device. In light of the above, an input device capable of providing vibration feedback has been proposed. The input device provides an operation sensation by applying a vibration to an operation surface in response to a touch operation.

For example, Patent Document 1 describes a tactile sensation-providing apparatus that applies a pressure to an operator's finger by causing an operation surface to vibrate based on a plurality of waveform patterns.

However, tactile sensations provided by the tactile sensation-providing apparatus described in Patent Document 1 are limited to one type of tactile sensation.

RELATED-ART DOCUMENTS

Patent Documents

Patent Document 1: Japanese Laid-Open Patent Publication No. 2017-129916

SUMMARY OF THE INVENTION

It is a general object of the present disclosure to provide an input device, a control method, and a non-transitory recording medium capable of providing a plurality of types of tactile sensations.

According to the present disclosure, an input device includes an operation member, an actuator configured to impart a tactile effect to the operation member, and a controller configured to apply, to the actuator, a control signal for starting to apply a first vibration to the operation member at a first timing and for starting to apply a second vibration to the operation member at a second timing after the first timing, such that a combined vibration of the first vibration and the second vibration is applied to the operation member. The controller is configured to change a duration of a first period of the combined vibration to two or more different durations of the first period by changing a control period of time that extends from the first timing to the second timing to two or more different control periods of time.

BRIEF DESCRIPTION OF THE DRAWINGS

Other objects and further features of the present invention will be apparent from the following detailed description when read in conjunction with the accompanying drawings, in which:

FIG. 3 is a timing diagram illustrating a second example of the operation of the input device;

DESCRIPTION OF THE EMBODIMENTS

According to the present disclosure, a plurality of types of tactile sensations can be provided.

The inventor has made earnest investigations such that one input device can produce operation sensations of a plurality of types of tactile switches. As a result, the inventor has found that an operation sensation of a tactile switch depends on the duration of a period of vibration, generated by the tactile switch, during which the amplitude of the vibration becomes maximum (hereinafter may be referred to as a "maximum vibration period"). Accordingly, operation sensations of a plurality of tactile switches can be produced by appropriately controlling the maximum vibration period of vibration applied to an operator.

In an input device that includes a spring-mass system, the spring-mass system vibrates at a natural resonance frequency. Therefore, it would not be easy to control the duration of the maximum vibration period of vibration.

In the following, vibrations generated by an input device will be described with reference to the embodiment.

Figure 1:
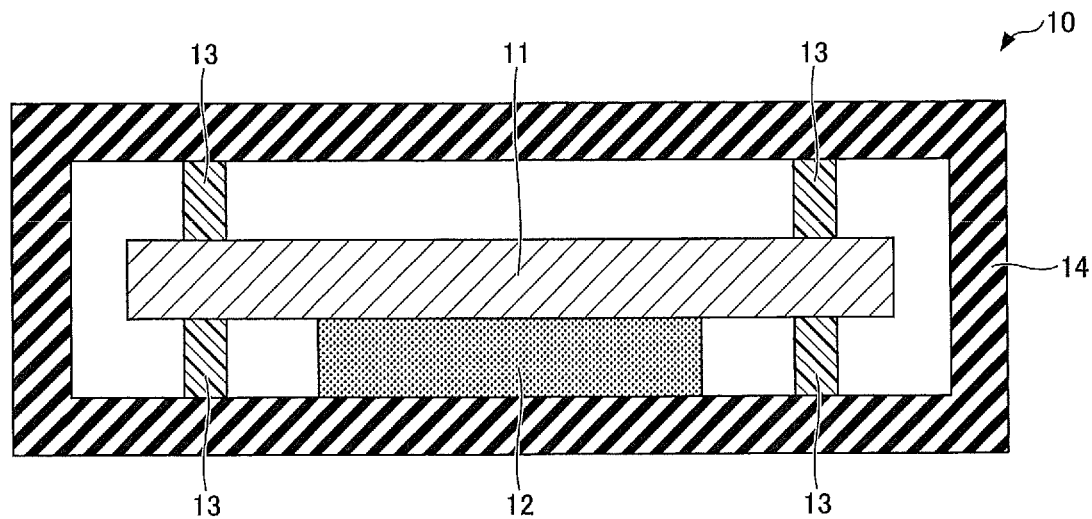
FIG. 1 is a schematic diagram illustrating an input device according to an embodiment.
Figure 2:
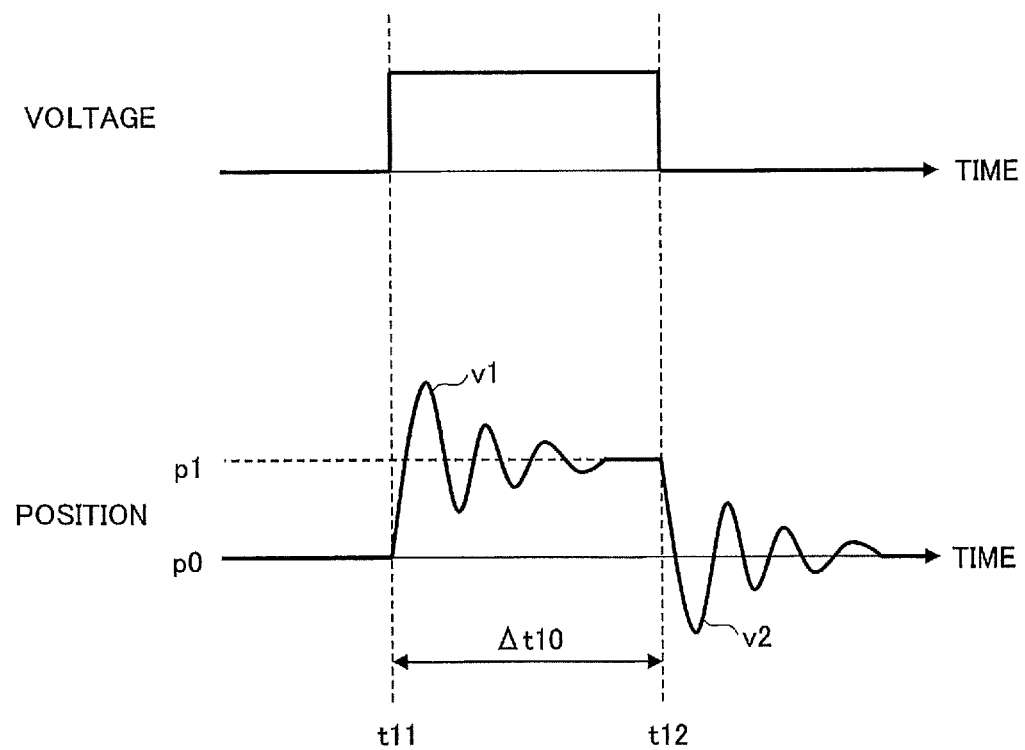
FIG. 2 is a timing diagram illustrating a first example of the operation of the input device.

FIG. 1 is a schematic diagram illustrating an input device according to the embodiment. FIG. 2 is a timing diagram illustrating a first example of the operation of the input device. FIG. 3 is a timing diagram illustrating a second example of the operation of the input device.

As illustrated in FIG. 1, an input device 10 according to the embodiment includes a movable part 11, a piezoelectric actuator 12, elastic support parts 13, and a housing 14 that is structurally rigid. The movable part 11 driven by the piezoelectric actuator 12 is supported by the elastic support parts 13 within the housing 14. For example, the movable part 11 includes a touchpad and a decorative panel. The movable part 11 and the elastic support parts 13 constitute a spring-mass system. Further, a voltage rising at time t11 and falling at time t12 is applied, as a control signal, to the piezoelectric actuator 12.

As illustrated in FIG. 2, when the voltage applied to the piezoelectric actuator 12 rises (at the time t11), the movable part 11 is driven by the piezoelectric actuator 12. At this time, a first vibration v1 is started and the movable part 11 is moved from initial position p0 to position p1. The neutral position of the first vibration v1 is the position p1. The frequency of the first vibration v1 is a resonance frequency f0 of the spring-mass system determined by the spring constant of the elastic support parts 13 and the mass of the movable part 11. The first vibration v1 attenuates over time.

Thereafter, when the voltage applied to the piezoelectric actuator 12 falls (at the time t12), a second vibration v2 is started and the movable part 11 is moved from the position p1 to the position p0. The neutral position of the second vibration v2 is the position p0. The frequency of the second vibration v2 is also the resonance frequency f0, and the second vibration v2 attenuates over time.

As illustrated in FIG. 2, if a period of time from the start of the first vibration v1 to the convergence of the first vibration v1 is longer than a period of time Δt10 from the time t11 to the time t12, the first vibration v1 and the second vibration v2 are independent of each other.

Conversely, if the period of time from the start of the first vibration v1 to the convergence of the first vibration v1 is shorter than the period of time Δt10, the second vibration v2 interferes with the first vibration v1. In this case, as of the time t12, the vibration of the movable part 11 becomes a vibration in which the first vibration v1 and the second vibration v2 are combined (a combined vibration). As used herein, the "combined vibration" includes not only a combined vibration of which the first vibration v1 and the second vibration v2 after the start of the second vibration v2, but also a combined vibration of the first vibration v1 and the second vibration v2 with an amplitude of zero before the start of the second vibration v2. Therefore, the "combined vibration" includes a vibration between the time t11 and the time t12 before the start of the second vibration v2. Further, the "combined vibration" includes the first vibration v1 and the second vibration v2 that are independent of each other as illustrated in FIG. 2.

Specifically, as illustrated in FIG. 3, if the period of time Δt10 is less than or equal to one half of a period of the first vibration v1, the first period of a combined vibration v12 becomes shorter than the period of the first vibration v1. This means that a duration Δt20 of the first period of the combined vibration v12 can be adjusted by controlling the period of time Δt10, thereby allowing multiple types of operation sensations of tactile switches to be provided.

Figure 4A:
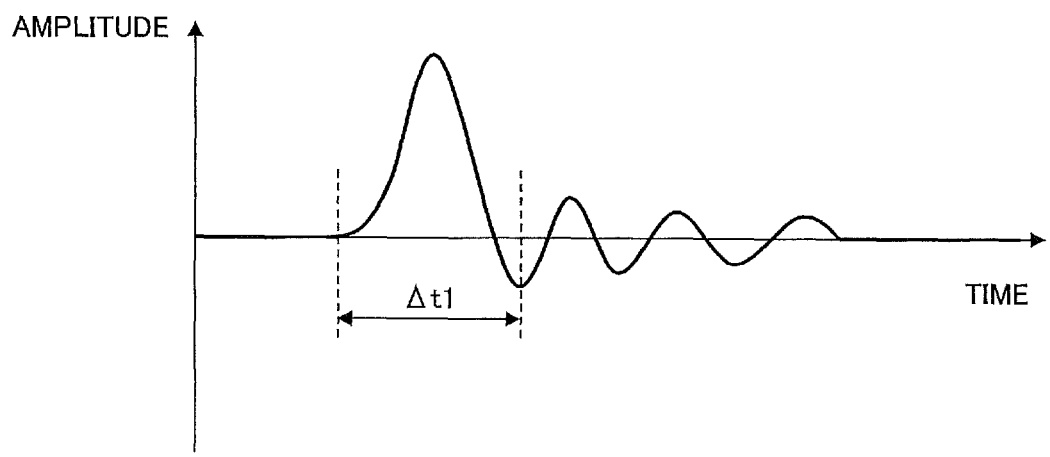
FIGS. 4A and 4B are graphs (part 1) indicating vibration characteristics of tactile switches.
Figure 4B:
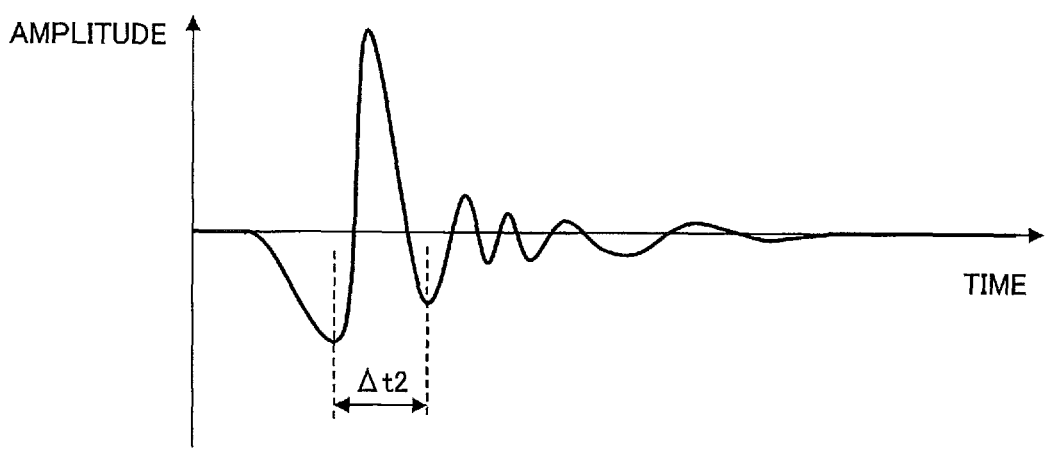
Figure 5A:
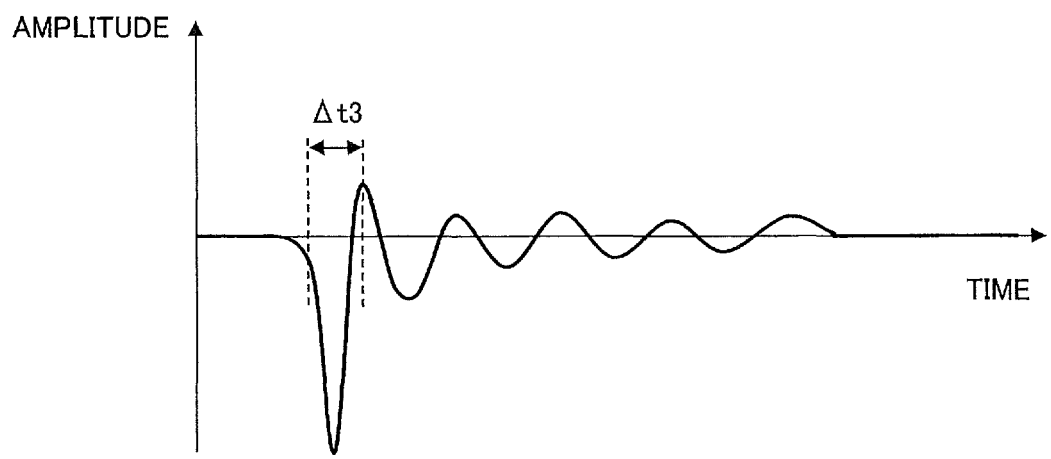
FIGS. 5A and 5B are graphs (part 2) indicating vibration characteristics of tactile switches.
Figure 5B:
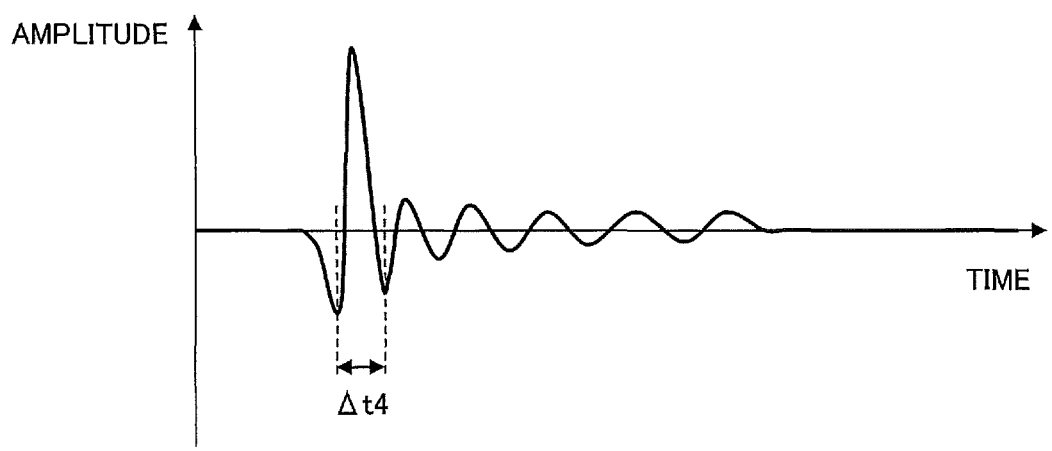

For example, FIGS. 4A and 4B and FIGS. 5A and 5B depict vibration characteristics of four tactile switches configured to produce operation sensations. The duration of the maximum vibration period of a tactile switch SW1 exhibiting vibration characteristics illustrated in FIG. 4A is denoted as Δt1, the duration of the maximum vibration period of a tactile switch SW2 exhibiting vibration characteristics illustrated in FIG. 4B is denoted as Δt2, the duration of the maximum vibration period of a tactile switch SW3 exhibiting vibration characteristics illustrated in FIG. 5A is denoted as Δt3, and the duration of the maximum vibration period of a tactile switch SW4 exhibiting vibration characteristics illustrated in FIG. 5B is denoted as Δt4.

In order for the four tactile switches SW1 through SW4 to produce operation sensations, the period of time Δt10 may be controlled in the piezoelectric actuator 12. That is, the period of time Δt10 may be controlled such that the duration Δt20 of the first period of the combined vibration v12 substantially matches each of the durations Δt1 through Δt4 of the tactile switches SW1 through SW4. In this manner, the input device 10 can produce operation sensations of the tactile switches SW1 through SW4.

Further, the maximum sensitivity of sensory organs in the fingers of humans is around 250 Hz. If a vibration with a frequency of approximately 250 Hz is applied, humans tend to feel a sharp operation sensation (clicking sensation). Conversely, if a vibration with a frequency of approximately. 100 Hz is applied, humans tend to feel a soft operation sensation. As the frequency becomes lower than 100 Hz, it becomes difficult to feel an operation sensation. Further, humans can also perceive vibrations of approximately 500 Hz. For this reason, the frequency in the first period of the combined vibration generated by the input device 10 is preferably 100 Hz to 500 Hz, and is more preferably 200 Hz to 400 Hz.

Further, preferably, the vibration of the spring-mass system is not readily perceived such that operation sensations imparted by the combined vibration v12 can be distinguished from the sensation of vibration of the spring-mass system. Accordingly, the resonance frequency of the vibration of the spring-mass system included in the input device 10 is preferably less than or equal to 100 Hz, and is more preferably less than or equal to 80 Hz. In addition, the frequency in the first period of the combined vibration v12 is preferably greater than or equal to the resonance frequency of the spring-mass system.

Further, the frequency in the first period of the combined vibration v12 may be similar to the resonance frequency of the spring-mass system so as to provide the softest operation sensation, among operation sensations produced by the input device 10. In this case, the softest operation sensation can be provided at the resonance frequency of the spring-mass system.

In the following, embodiments of the present disclosure will be described in detail with reference to the accompanying drawings. In the specification and drawings, elements having substantially the same functions or configurations are referred to by the same reference numerals, and a duplicate description thereof may be omitted.

Figure 6:
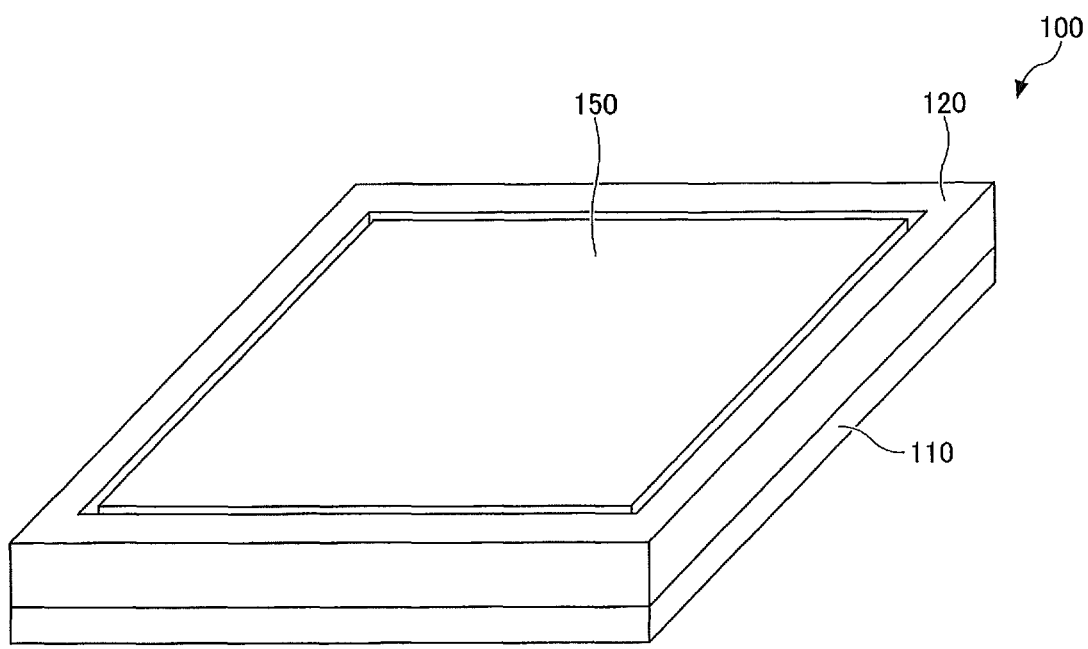
FIG. 6 is a perspective view of an input device according to the embodiment.
Figure 7:
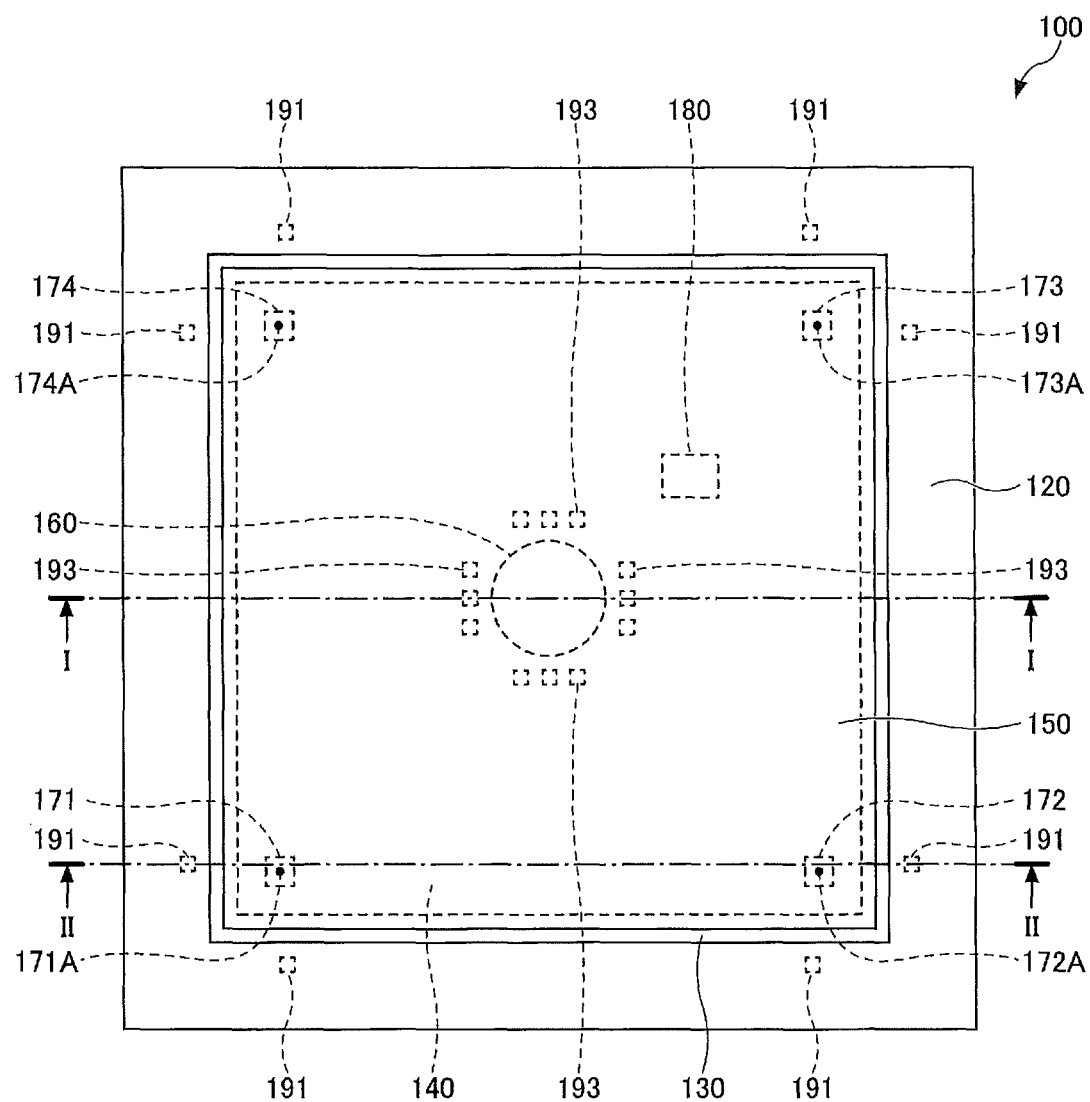
FIG. 7 is a top view of the input device according to the embodiment.
Figure 8A:
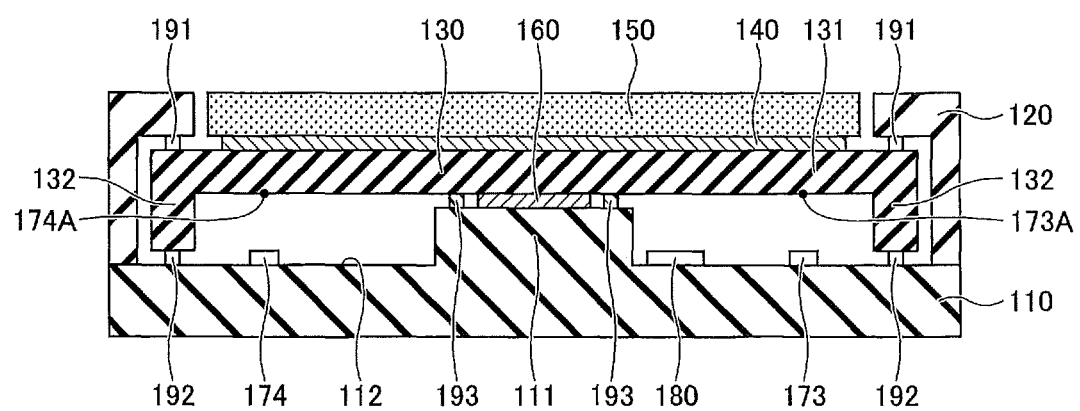
FIGS. 8A and 8B are cross-sectional views of the input device according to the embodiment.
Figure 8B:
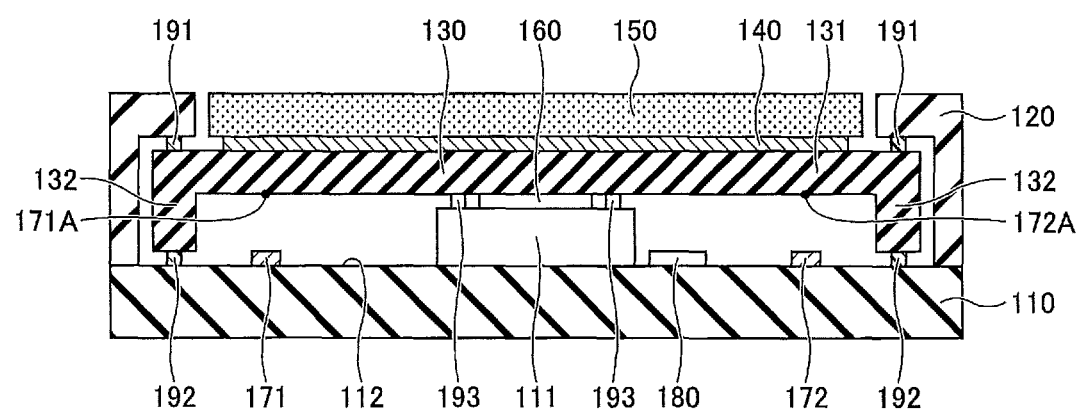

An input device including a piezoelectric actuator; which is an example of an actuator, will be described. FIG. 6 is a perspective view of an input device according to an embodiment. FIG. 7 is a top view of the input device according to the embodiment. FIGS. 8A and 8B are cross-sectional views of the input device according to the embodiment. FIG. 8A corresponds to a cross-sectional view taken through I-I of FIG. 7. FIG. 8B corresponds to a cross-sectional view taken through II-II of FIG. 7.

As illustrated in FIG. 6 through FIG. 8B, an input device 100 according to an embodiment includes a fixed base 110, a bezel 120 fixed on the periphery of the fixed base 110, and a decorative panel 150 located inside the bezel 120. A touchpad 140 is disposed on the fixed base 110 side of the decorative panel 150. A movable base 130 is disposed on the fixed base 110 side of the touchpad 140. The movable base 130 includes a flat plate part 131 wider than both the touchpad 140 and the decorative panel 150 in planar view, and includes a wall part 132 extending from the perimeter edge of the flat plate part 131 toward the fixed base 110. The fixed base 110 has a protrusion 111 at the center in planar view, and an actuator 160 is disposed on the protrusion 111. The actuator 160 may be a piezoelectric actuator, and contacts the protrusion 111 and the flat plate part 131. The touchpad 140 is an example of a touchpad, the movable base 130 is an example of a holder that holds the touchpad 140. The touchpad 140 and the movable base 130 are included in an operation panel member. The operation panel member is an example of an operation member. The fixed base 110 is an example of a support member.

A plurality of rubber components 192 are disposed between the wall part 132 and the fixed base 110 and are in contact with the wall part 132 and the fixed base 110. The rubber components 192 are arranged at least at positions of apexes of a triangle in planar view. For example, the rubber components 192 are arranged around each of the four corners of the touchpad 140 in planar view.

A plurality of rubber components 191 are disposed between the flat plate part 131 and the bezel 120 and are in contact with the flat plate part 131 and the bezel 120. The rubber components 191 are arranged at least at positions of apexes of a triangle in planar view. For example, the rubber components 191 are arranged around each of the four corners of the touchpad 140 so as to overlap the rubber components 192 in planar view. The rubber components 191 and 192 are examples of an elastic member.

A plurality of rubber components 193 are disposed between the protrusion 111 and the flat plate part 131 and are in contact with the protrusion 111 and the flat plate part 131. The rubber components 193 are arranged at least at positions of apexes of a triangle around the actuator 160 in planar view. For example, the rubber components 193 are arranged at three respective positions between the actuator 160 and each of the four sides of the touchpad 140 (at positions closer to the center of the touchpad 140 in planar view than are the rubber components 191 and the rubber components 192).

For example, the rubber components 193 are harder than the rubber components 191 and the rubber components 192. The rubber components 191 and the rubber components 192 have substantially the same hardness. The rubber components 191 and the rubber components 192 are examples of a first elastic member. The rubber components 193 are examples of a second elastic member. The flat plate part 131 is supported via the elastic members such that a touch surface of the touchpad 140 is tiltable.

Further, a plurality of photo interrupters 171, 172, 173, and 174 are disposed on the fixed base 110. The photo interrupters 171 through 174 are able to emit light to points 171A through 174A and receive light reflected from the flat plate part 131. The points 171A through 174A are located on the flat plate part 131 of the movable base 130 and above the photo interrupters 171 through 174. Accordingly, the photo interrupters 171, 172, 173, and 174 can detect the distances to the points of the flat plate part 131 to which light is emitted. For example, the photo interrupters 171 through 174 are disposed inward relative to the four corners of the touchpad 140 in planar view. The photo interrupters 171 through 174 are arranged at least at positions of apexes of a triangle in planar view. The photo interrupters 171 through 174 are examples of first through fourth sensors (photosensors). The first through fourth sensors (photosensors) are examples of a sensor. A surface 112 of the fixed base 110 on which the photo interrupters 171 through 174 are disposed is an example of a reference plane. The reference plane is spaced apart from the operation panel member (that includes the movable base 130 and the like). In the present embodiment, the reference plane is designated as a reference plane containing the X axis and the Y axis, and a direction perpendicular to the reference plane is designated as a Z-axis direction (a first direction).

Further, a signal processing unit 180 is disposed on the fixed base 110. The signal processing unit 180 performs a process as will be described later to drive the actuator 160 in response to a touch operation on the touchpad 140, thereby providing tactile feedback to a user. The signal processing unit 180 may be a semiconductor chip, for example. In the present embodiment, the signal processing unit 180 is disposed on the fixed base 110; however, the position of the signal processing unit 180 is not limited thereto, and the signal processing unit 180 may be provided between the touchpad 140 and the movable base 130, for example. The signal processing unit 180 is an example of a controller.

As an example operation of the input device 100 configured as described above, the actuator 160 vibrates in the direction perpendicular to the touch surface of the touchpad 140 in response to a touch operation on the touchpad 140 in accordance with the position and load of the touch operation. By feeling the vibration on the touch surface, the user is able to recognize what response is given to his/her touch operation performed on the input device 100, without visually checking a display device of the input device 100 or the like. For example, if the input device 100 is provided in the center console of an automobile for use as various switches, a driver is able to recognize what response is given to his/her touch operation based on the vibration of the actuator 160, without turning his/her eyes to the input device 100. Note that the actuator 160 is not limited to the above-described example, and may be configured to generate a vibration in any direction.

Next, the basic concept of a process for detecting a load applied to the touchpad 140 according to the present embodiment will be described. In the present embodiment, the distance to the flat plate part 131 detected by each of the photo interrupters 171 through 174 and the coordinates of a touched position detected by the touchpad 140 are used to derive an equation of a plane regarding the flat plate part 131, that is, an equation of the plane containing the points 171A through 174A, followed by obtaining a displacement at the touched position.

Figure 9:
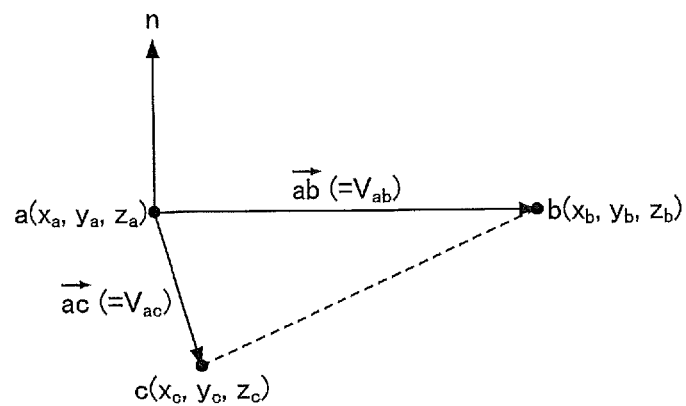
FIG. 9 is a diagram illustrating an XYZ coordinate system.

In the following, an equation of a plane will be described. FIG. 9 is a drawing illustrating an XYZ coordinate system. In the XYZ coordinate system, there are three points. The three points are a point a $(x_a, y_a, z_a)$, a point b $(x_b, y_b, z_b)$, and a point c $(x_c, y_c, z_c)$. In this case, the components $(x_1, y_1, z_1)$ of a vector ac (hereinafter may be referred to as "$V_{ac}$") are $(x_c-x_a, y_c-y_a, z_c-z_a)$, and the components $(x_2, y_2, z_2)$ of a vector ab (hereinafter may be referred to as "$V_{ab}$") are $(x_b-x_a, y_b-y_a, z_b-z_a)$. Accordingly, the cross product $(V_{ac} \cdot V_{ab})$ is $(y_1z_2-z_1y_2, z_1x_2-x_1z_2, x_1y_2-y_1x_2)$. This cross product corresponds to a normal vector of a plane containing the point a, the point b, and the point c. When $(y_1z_2-z_1y_2, z_1x_2-x_1z_2, x_1y_2-y_1x_2)$ is designated as (p, q, r), an equation of the plane containing the point a, the point b, and the point c is represented by the following equation (1).

$$p(x-x_a)+q(y-y_a)+r(z-z_a)=0 \quad (1)$$

Figure 10:
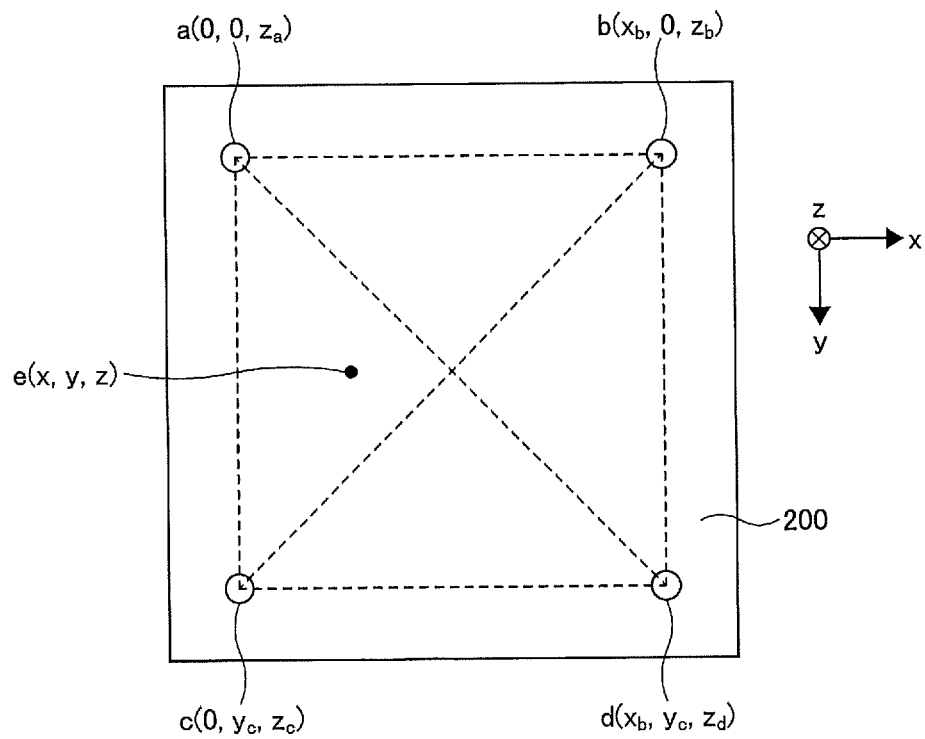
FIG. 10 is a diagram illustrating positional relationships in an XYZ orthogonal coordinate system.

The equation (1), which is a general formula, may be simplified by using, as an XYZ coordinate system, an orthogonal coordinate system in which the X coordinate and Y coordinate of the point a are zero. FIG. 10 is a diagram illustrating positional relationships in an XYZ orthogonal coordinate system. As illustrated in FIG. 10, in this XYZ orthogonal coordinate system, there are four points on a plane 200. The four points area point a $(0,0,z_a)$, a point b $(x_b, 0, z_b)$, a point c $(0, y_c, z_c)$ and a point d $(x_b, y_c, z_d)$. The coordinates of the point a, the point b, and the point c are related as follows.

$$V_{ac}=(0,y_c,z_c-z_a)=(x_1,y_1,z_1)$$

$$V_{ab}=(x_b,0,z_b-z_a)=(x_2,y_2,z_2)$$

$$V_{ac} \cdot V_{ab}=(y_c(z_b-z_a),(z_c-z_a)x_b,-y_c x_b)=(p,q,r)$$

As a result, an equation of the plane 200 containing the point a, the point b, and the point c is represented by the following equation (2).

$$y_c(z_b-z_a)x+(z_c-z_a)x_b y - y_c x_b(z-z_a)=0 \quad (2)$$

Then, the equation (2) can be represented as an equation (3) as follows.

$$Z=(z_b-z_a)x/x_b+(z_c+z_a)y/y_c+z_a \quad (3)$$

Accordingly, the Z coordinates of the three points on the plane 200 may be identified by the first sensor, the second sensor, and the third sensor, and the X coordinate and the Y coordinate of the touched position on the plane 200 may be identified by the touchpad. Then, the Z coordinate of the touched position can be identified. Further, a displacement in the Z-axis direction at the touched position may be obtained from a change in the Z coordinate occurring upon the touch operation.

In the present embodiment, the X coordinate and Y coordinate of the touched position on the touchpad 140 can be obtained by the touchpad 140. Namely, when contact is made to a point e in FIG. 10, an X coordinate (x) and a Y coordinate (y) of the point e can be derived from the outputs of the touchpad 140. Further, photo interrupters corresponding to the point a, the point b, and the point c may be arranged as the first sensor, the second sensor, and the third sensor, respectively, and the X coordinate $(x_b)$ of the point b and the Y coordinate $(y_c)$ of the point c may be obtained in advance. Then, the outputs of the photo interrupters may be used to detect the distances to the flat plate part 131 to obtain the Z coordinates $(z_a, z_b, z_c)$ of these respective points, followed by calculating the Z coordinate (z) of the point e from the equation (3).

Namely, in the initial state, the plane 200 of the touchpad 140 and a plane containing the three photo interrupters arranged at the positions corresponding to the point a, the point b, and the point c may be parallel to each other. The coordinates of the point e may then be obtained after the flat plate part 131 and the touchpad 140 tilt upon pressure applied to the touchpad 140. Accordingly, a displacement in the Z-axis direction at the point e occurring upon the application of pressure can be obtained. Even if the plane 200 and the plane containing the three photo interrupters are not parallel to each other in the initial state, a displacement in the Z-axis direction at the point e in response to the application of pressure can be obtained by a similar calculation.

Figure 11A:
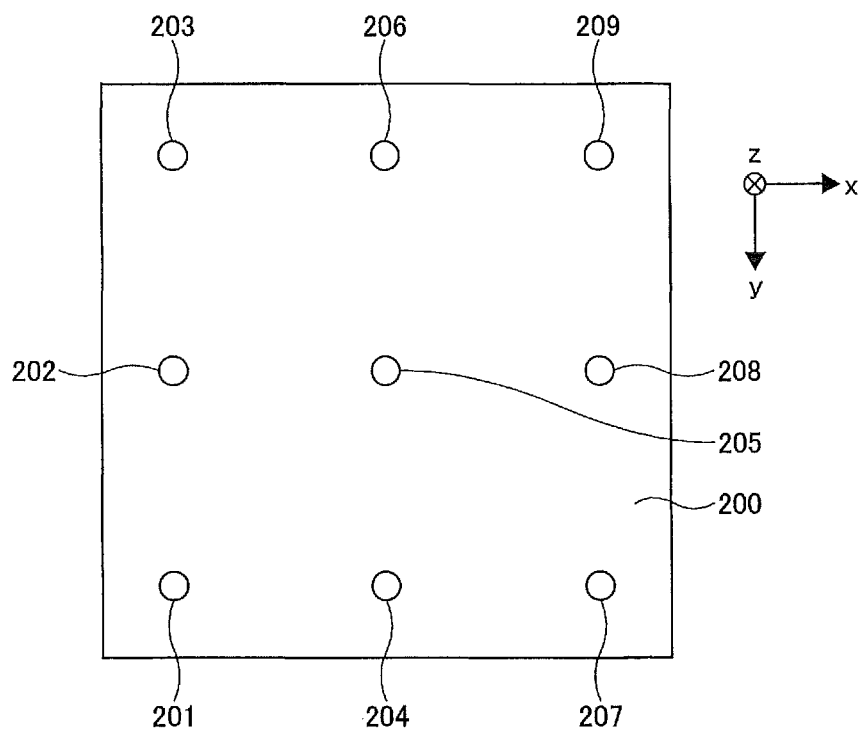
FIGS. 11A and 11B are diagrams illustrating example relationships between applied loads and displacements in the Z-axis direction.
Figure 11B:
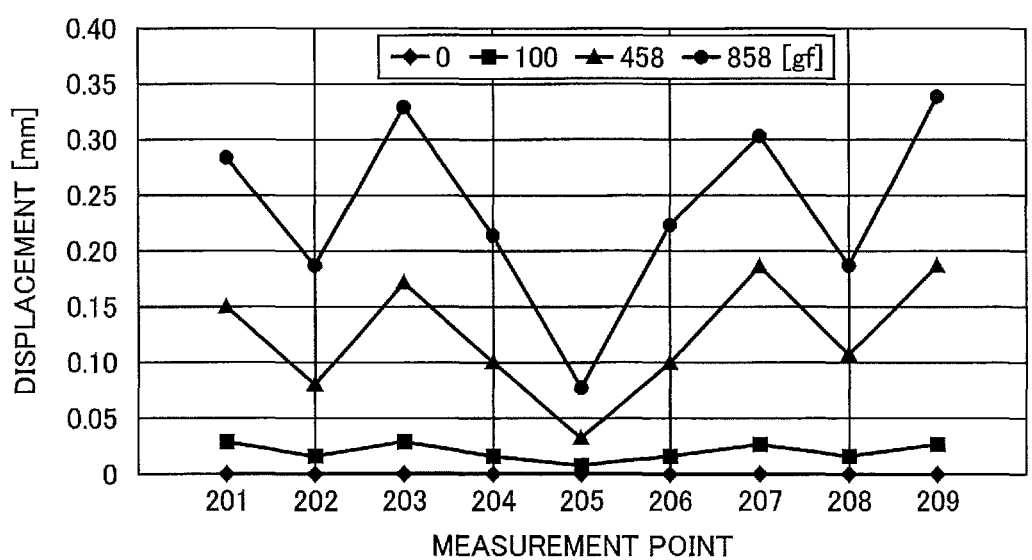

Further, a displacement in the Z-axis direction at the point e in response to a touch operation may be used to determine whether a load exerted on the point e exceeds a predetermined reference value, and tactile feedback can be controlled based on the determination result. Namely, the relationships between loads exerted on a plurality of points on the plane 200 and displacements in the Z-axis direction may be obtained in advance. Then, it is determined whether the displacement in the Z-axis direction obtained through the above-described method exceeds a threshold value corresponding to the reference value, followed by controlling tactile feedback. FIGS. 11A and 11B are diagrams illustrating example relationships between applied loads and displacements in the Z-axis direction.

As illustrated in FIG. 11A, touch operations are performed at 9 measurement grid points 201, 202, 203, 204, 205, 206, 207, 208, and 209, with loads of 0 gf (0 N), 100 gf (0.98 N), 458 gf (4.5 N), and 858 gf (8.4 N) as illustrated in FIG. 11B. Further, tactile feedback is given when a load exceeding 458 gf (4.5 N), which is used as a reference value, is applied. Note that because the actuator 160 and the like are provided under the movable base 130, displacements differ depending on the position of measurement.

When a touch operation is performed at any of the measurement points 201 through 209, it can be determined whether the applied load exceeds the reference value based on the relationships illustrated in FIG. 11B. Namely, if a displacement in the Z-axis direction as calculated from the equation (3) exceeds the displacement corresponding to 458 gf (4.5 N) indicated in FIG. 11B, it is determined that the applied load exceeds the reference value. In a case where a touch operation is performed at the measurement point 201, for example, a displacement threshold value is 0.15 mm. In this case, if a displacement exceeds 0.15 mm, it is determined that the applied load exceeds the reference value for generating tactile feedback.

Figure 12:
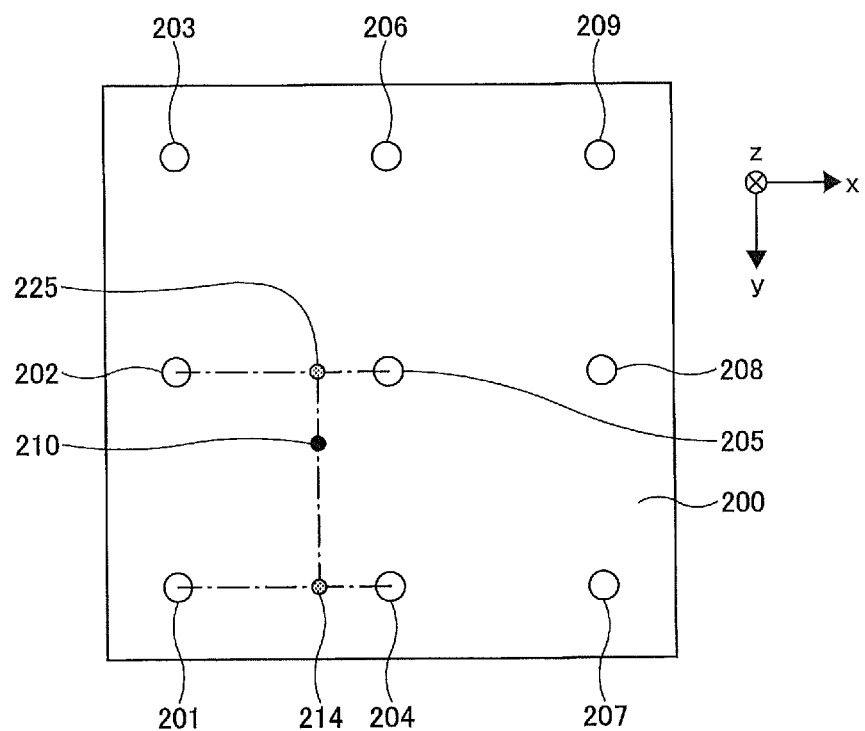
FIG. 12 is a diagram illustrating positional relationships in an example method of determining a load.
Figure 13A:
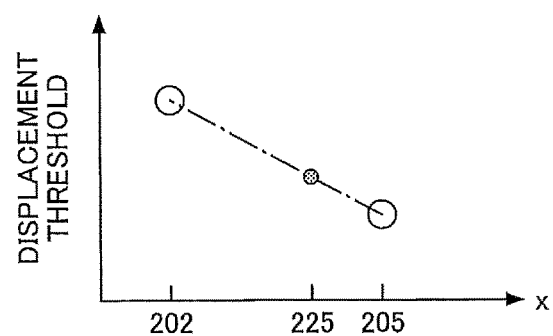
FIGS. 13A through 13C are diagrams illustrating linear interpolation in the example method of the determining load.
Figure 13B:
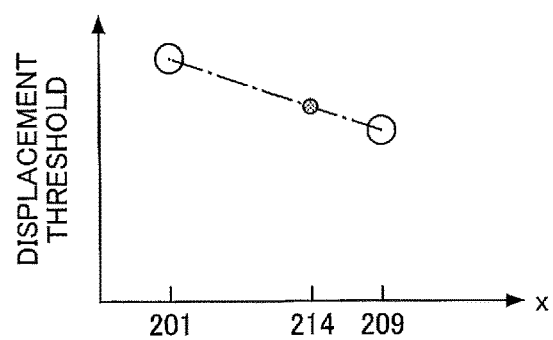
Figure 13C:
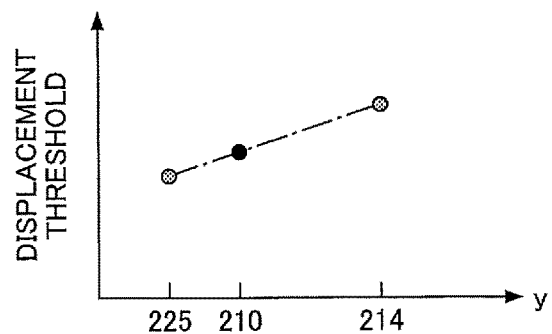

If a touch operation is performed at a position different from the measurement points 201 through 209, it can be determined whether the applied load exceeds the reference value by using displacement thresholds at the measurement points around such a position. FIG. 12 and FIG. 13A through 13C are diagrams illustrating an example method of determining a load. As illustrated in FIG. 12, a touch operation is assumed to be performed at a point 210 inside the rectangle defined by the measurement points 201, 202, 204, and 205. In this case, as illustrated in FIG. 13A, a displacement threshold at a point 225 which has the same Y coordinate as the point 210 between the two measurement points 202 and 205 aligned in the X-axis direction is calculated through linear interpolation from the respective thresholds of the measurement points 202 and 205. Similarly, as illustrated in FIG. 13B, a displacement threshold at a point 214 which has the same Y coordinate as the point 210 between the two measurement points 201 and 204 aligned in the X-axis direction is calculated through linear interpolation from the respective threshold values of the measurement points 201 and 204. Further, as illustrated in FIG. 13C, the threshold at the point 210 is calculated through linear interpolation from the respective threshold values of the points 225 and 214. Separately from the above, a displacement in the Z-axis direction at the point 210 can be calculated by the above-described equation (3). By comparing these values, it can be determined whether the load applied to the point 210 different from the measurement points 201 through 209 exceeds the reference value.

Figure 14:
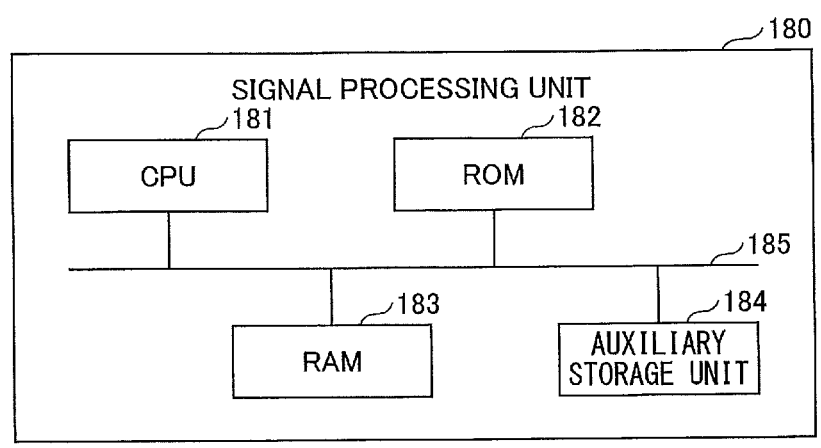
FIG. 14 is a diagram illustrating a configuration of a signal processing unit.

Based on the above-described basic concept, the signal processing unit 180 determines whether a load applied to a touched position on the touchpad 140 exceeds the reference value for generating tactile feedback. If the reference value is exceeded, the signal processing unit 180 activates the actuator 160 to generate tactile feedback. FIG. 14 is a diagram illustrating a configuration of the signal processing unit 180.

The signal processing unit 180 includes a CPU (central processing unit) 181, a ROM (read-only memory) 182, a RAM (random-access memory) 183, and an auxiliary storage unit 184. The CPU 181, the ROM 182, the RAM 183, and the auxiliary storage unit 184 constitute a computer. The components of the signal processing unit 180 are connected to one another through a bus 185.

The CPU 181 executes various types of programs (such as a load determination program) stored in the auxiliary storage unit 184.

The ROM 182 is a nonvolatile main memory device. The ROM 182 stores various programs, data, and the like necessary for the CPU 181 to execute the various types of programs stored in the auxiliary storage unit 184. Specifically, the ROM 182 stores boot programs such as Basic Input/Output System (BIOS) and Extensible Firmware Interface (EFI).

The RAM 183 is a volatile main memory device such as a dynamic random-access memory (DRAM) and a static random-access memory (SRAM). The RAM 183 serves as a work area to which the various types of programs stored in the auxiliary storage unit 184 are loaded when executed by the CPU 181.

The auxiliary storage unit 184 is an auxiliary storage device for storing the various types of programs executed by the CPU 181 and various data generated by the CPU 181 executing the various types of programs.

Figure 15:
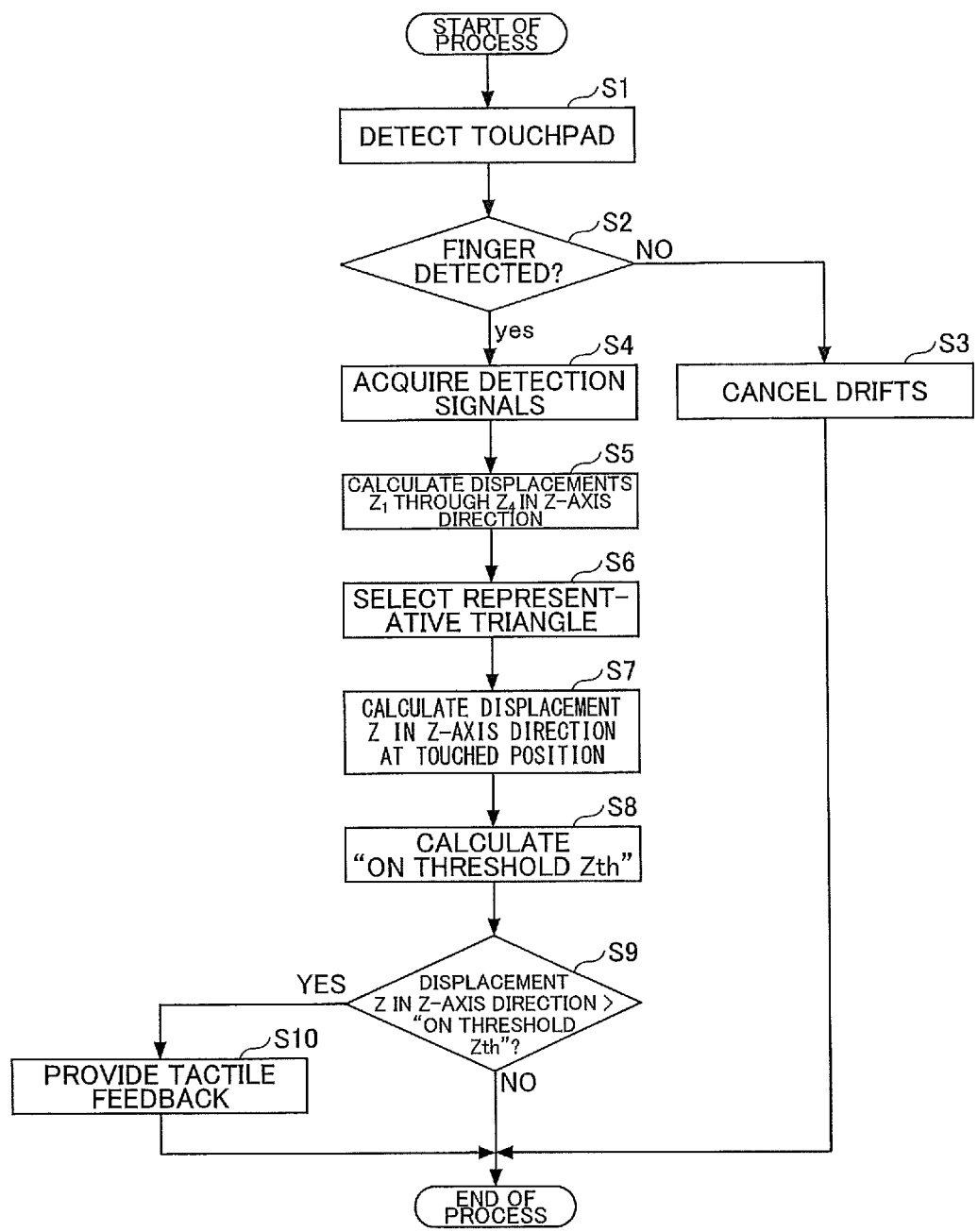
FIG. 15 is a flowchart illustrating a process performed by the signal processing unit.

The signal processing unit 180 having the hardware configuration as described above performs a process as described below. FIG. 15 is a flowchart illustrating a process performed by the signal processing unit 180.

First, the signal processing unit 180 detects the touchpad 140 (step S1). Then, the signal processing unit 180 determines whether a user's finger is in contact with the touchpad 140 (step S2). If the signal processing unit 180 determines that a user's finger is not in contact with the touchpad 140, the drifts of the photo interrupters 171 through 174 are canceled (step S3).

Conversely, if the signal processing unit 180 determines that a user's finger is in contact in contact with the touchpad 140, the signal processing unit 180 acquires respective detection signals from the photo interrupters 171 through 174 (step S4). For example, if the signals output from the photo interrupters 171 through 174 are analog signals, the signal processing unit 180 acquires the signals that have been converted into digital signals.

Next, the detection signals of the photo interrupters 171 through 174 are used to calculate displacements $Z_1$ through $Z_4$ in the Z-axis direction at respective detection points on the flat plate part 131 (step S5).

Thereafter, one triangle is selected as a representative triangle from a plurality of triangles defined by three of the four photo interrupters 171 through 174 (step S6). Preferably, the representative triangle may be a triangle that contains therein the touched position on the touchpad 140. In the example of FIG. 10, if the point e is touched, a triangle acd or a triangle ab may preferably be used. This is because the shorter the distance between the touched position and the photo interrupters 171 through 174 is, the higher the accuracy is.

Next, a displacement Z in the Z-axis direction at the touched position on the touchpad 140 is calculated (step S7). Namely, the equation (3) is used to calculate the displacement Z in the Z-axis direction at the touched position based on the X coordinate and Y coordinate of the touched position detected by the touchpad 140 and the displacements in the Z-axis direction calculated from the detection signals of the three photo interrupters selected as constituting the representative triangle in step S6.

Further, the relationships between applied loads and displacements in the Z-axis direction, which are obtained in advance as in the example illustrated in FIG. 11B and stored in the ROM 182, are retrieved, and then a threshold Zth (an ON threshold Zth) in the Z-axis direction at the touched position is calculated (step S8).

Then, it is determined whether the displacement Z exceeds the ON threshold Zth (step S9). If the ON threshold Zth is exceeded, the applied load is regarded as exceeding the reference value. In this case, the actuator 160 is activated to provide tactile feedback (step S10).

In this manner, the input device 100 according to the present embodiment provides tactile feedback. The photo interrupters 171 through 174 are able to detect the Z coordinates of the points 171A-through 174A on the flat plate part 131 with high accuracy, and the touchpad 140 is able to detect the X coordinate and Y coordinate of the touched position with high accuracy. As a result, the above-described process allows the Z coordinate of the touched position to be also detected with high accuracy. Even when the ON threshold Zth is a small value of several tens of micrometers, whether or not to provide tactile feedback can be determined with high accuracy.

The rubber components 193 disposed around the actuator 160 are preferably harder than the rubber components 191 and rubber components 192 disposed in the vicinity of the peripheral edge of the movable base 130. The rubber components 191 and the rubber components 192 support the movable base 130 between the fixed base 110 and the bezel 120 to the extent to which the actuator 160 is able to vibrate the movable base 130. If the hardness of the rubber components 191 and the rubber components 192 were excessively high, it would be difficult to make a user feel a vibration upon the activation of the actuator 160. Conversely, the easier it is for the movable base 130 to tilt in response to a touch operation, the more likely it is for the displacements Z1 through Z4 in the Z-axis direction by the photo interrupters 171 through 174 to increase, and the more likely it is for error to be reduced. Further, the harder the rubber components 193 are, the greater the repulsive force to a user is. Accordingly, the rubber components 193 are preferably harder than the rubber components 191 and the rubber components 192.

Figure 16:
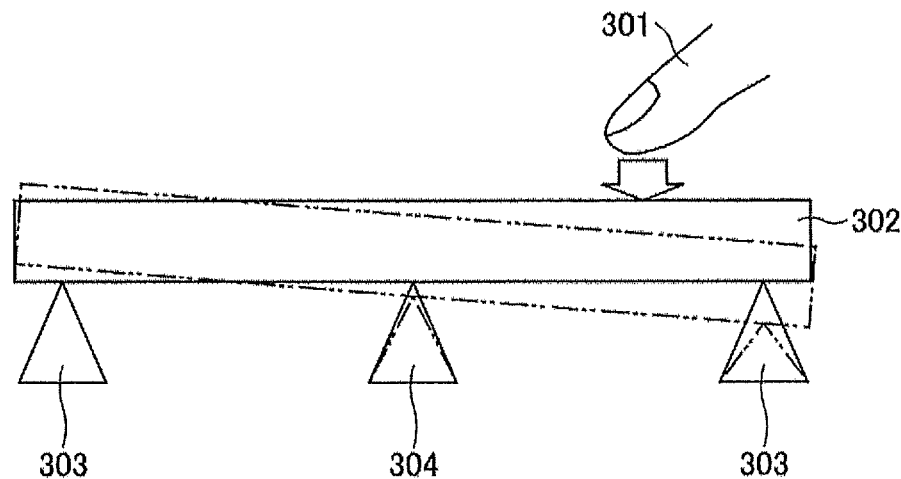
FIG. 16 is a schematic diagram illustrating the tilt of a movable base.

FIG. 16 is a schematic diagram illustrating the tilt of the movable base. As illustrated in FIG. 16, an operation panel member 302, which includes the movable base 130 and the touchpad 140, is provided with rubber components 303 at the perimeter thereof, and is provided with a rubber component 304 at the center thereof. The rubber components 303 corresponds to the rubber components 191 and the rubber components 192, and the rubber component 304 correspond to the rubber components 193. In this case, pressing the operation panel member 302 with a finger 301 at a position near the perimeter thereof causes a rubber component 303 situated near the perimeter of the operation panel member 302 to be compressed to a large extent, while the rubber component 304 is hardly compressed. Further, the operation panel member 302 is lifted above the rubber component 303. As a result, large displacements of the operation panel member 302 are observed near both of the rubber components 303. If the hardness of the rubber component 304 were comparable with the hardness of the rubber components 303, all of the rubber component 304 and the rubber components 303 would be compressed with only small differences therebetween. As a result, relatively small displacements of the operation panel member 302 would be observed near both of the rubber components 303. Note that the actuator 160 of the input device 100 also serves as part of the rubber component 304 of FIG. 16 to provide a fulcrum point.

Further, in the above-described process, one representative triangle is identified, a displacement at a touched position is calculated, and, a determination is made based on the displacement. Alternatively, two or more representative triangles may be identified, displacements (such as a first displacement and a second displacement) may be calculated for the respective representative triangles, the average value of these displacements may be obtained, and a determination may be made based on the average value. Such a process allows a more accurate determination to be made.

Further, the photo interrupters 171 through 174 do not contact the flat plate part 131. Thus, the photo interrupters 171 through 174 do not affect the movement of the touchpad 140 responding to a touch operation. Non-contact position detection sensors such as electrostatic sensors may be used in place of the photo interrupters 171 through 174. Further, contact pressure sensors may be used.

Figure 17:
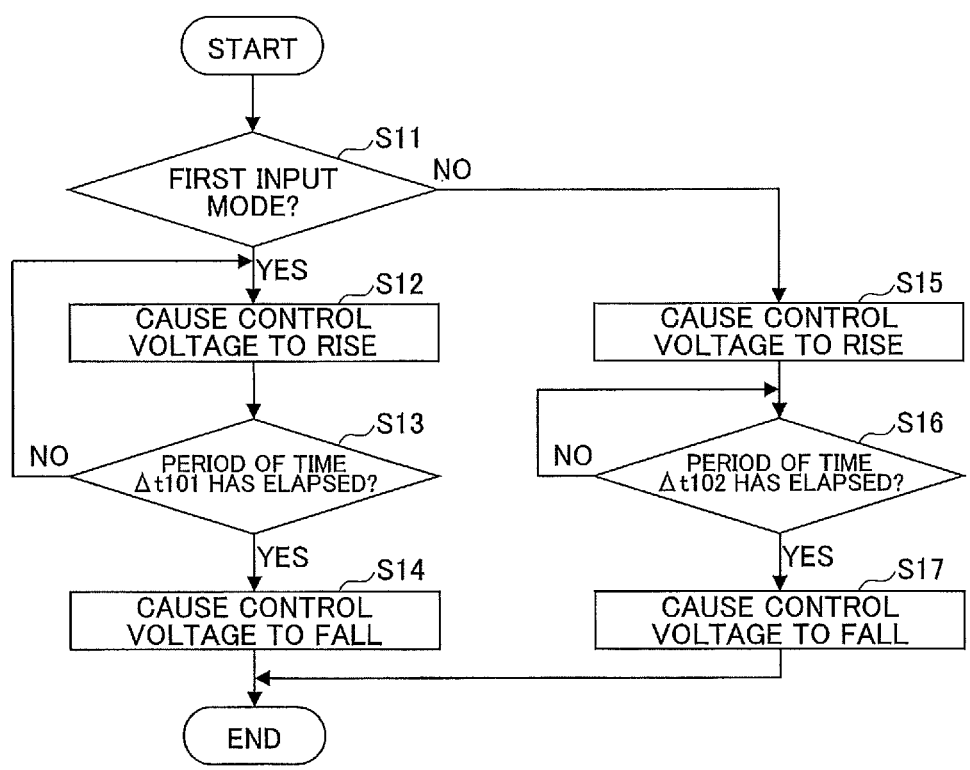
FIG. 17 is a flowchart illustrating details of a process for providing tactile feedback by the signal processing unit.

Next, a process for providing tactile feedback in step S10 by the signal processing unit 180 will be described. The input device 100 according to the present embodiment is configured to produce operation sensations of the two tactile switches that exhibit the vibration characteristics illustrated in FIGS. 4A and 4B in accordance with respective input modes. Data of control periods of time, which will be described later, can be stored in the ROM 182 in advance. FIG. 17 is a flowchart illustrating details of a process for providing tactile feedback by the signal processing unit 180.

The input modes may depend on the applications of the input device 100. For example, if the input device 100 is provided in the center console of an automobile, the input device 100 is used to perform self-driving settings, air conditioner operations, audio equipment operations, and navigation equipment operations. In the present embodiment, two input modes, a self-driving setting mode and an air conditioner operation mode, are assumed to be available. However, any input modes may be set in accordance with the operations in automobiles. Further, input modes may be set in accordance with the types of automobiles. For example, input modes may be different between sedans and sport utility vehicles.

The signal processing unit 180 applies a first control signal and a second control signal to the actuator 160. The first control signal is for providing the operation sensation of the tactile switch SW1. The second control signal is for providing the operation sensation of the tactile switch SW2.

In the process for providing the tactile feedback (step S10), the signal processing unit 180 first determines whether the current input mode of the input device 100 is an input mode for providing the operation sensation of the tactile switch SW1 (first input mode) (step S11). If the signal processing unit 180 determines that the current input mode of the input device 100 is the input mode for providing the operation sensation of the tactile switch SW1 (first input mode), the process proceeds to step S12. Conversely, If the signal processing unit 180 determines that the current input mode of the input device 100 is not the first input mode, the current input mode is regarded as an input mode for providing the operation sensation of the tactile switch SW2 and the process proceeds to step S15. For example, the input mode for providing the operation sensation of the tactile switch SW1 may be the air conditioner operation mode, and the input mode for providing the operation sensation of the tactile switch SW2 may be the self-driving setting mode.

In step S12, the signal processing unit 180 causes a control voltage applied to the actuator 160 to rise (a first timing). As a result, the actuator 160 is driven to start the first vibration and cause the movable base 130, the touchpad 140, and the decorative panel 150 to be moved in the first direction.

At a second timing at which a predetermined control period of time $\Delta t101$ has elapsed (step S13) from the first timing of the rising of the control voltage in step S12, the signal processing unit 180 causes the control voltage applied to the actuator 160 to fall (step S14). As a result, the state of the actuator 160 changes to the initial state. This causes the second vibration to be started and the movable base 130, the touchpad 140, and the decorative panel 150 to be moved in a direction opposite to the first direction. At this time, the movable base 130, the touchpad 140, and the decorative panel 150 start to be subjected to the combined vibration of the first vibration and the second vibration. The control period of time $\Delta t101$ is set to match the duration $\Delta t1$ (see FIG. 4A) of the first period of the combined vibration. For example, the control period of time $\Delta t101$ is less than or equal ta one half of the period of the first vibration. Further, the second vibration is in a direction that causes the first vibration to converge.

Conversely, in step S15, the signal processing unit 180 causes a control voltage applied to the actuator 160 to rise (a first timing). As a result, the actuator 160 is driven to start the first vibration and cause the movable base 130, the touchpad 140, and the decorative panel 150 to be moved in the first direction.

At a second timing at which a predetermined control period of time $\Delta t102$ has elapsed (step S16) from the first timing of the rising of the control voltage in step S15, the signal processing unit 180 causes the control voltage applied to the actuator 160 to fall (step S17). As a result, the state of the actuator 160 changes to the initial state. This causes the second vibration to be started and the movable base 130, the touchpad 140, and the decorative panel 150 to be moved in the direction opposite to the first direction. At this time, the movable base 130, the touchpad 140, and the decorative panel 150 start to be subjected to the combined vibration of the first vibration and the second vibration. The control period of time $\Delta t102$ is set to be different from the control period of time $\Delta t101$, and is set to match the duration $\Delta t2$ (see FIG. 4B) of the first period of the combined vibration. For example, the control period of time $\Delta t102$ is less than or equal to one half of the period of the first vibration. Further, the second vibration is in the direction that causes the first vibration to converge.

The signal processing unit 180 performs the above-described process at the time of providing tactile feedback (step S10). Accordingly, the input device 100 can provide an operator with tactile feedback that simulates the operation sensation of the tactile switch SW1 or SW2 in accordance with the corresponding input mode.

Note that the number of types of operation sensations provided by the input device according to the present disclosure is not limited to two, and may be three or more. That is, the number of control periods of time, extending from the first timing at which to start the first vibration to the second timing at which to start the second vibration, may be three or more.

The actuator is not limited to the piezoelectric actuator, and may be a magnetic actuator. For example, if a magnetic actuator is used, the signal processing unit 180 may start the first vibration by starting to apply the current instead of causing the voltage to rise, and may start the second vibration by stopping to apply the current instead of causing the voltage to fall.

The operation member is not limited to the operation panel member such as the touchpad 140, and may be a push button having an operation surface.

The input device according to the present disclosure is particularly suitable as an input device provided in the center console of an automobile. The driver of the automobile can check his/her touch operation without looking away from the road by receiving tactile feedback from the input device.

Although specific embodiments have been described above, the present invention is not limited to the particulars of the above-described embodiments. Variations and modifications may be made without departing from the scope of the subject matter recited in the claims.

What is claimed is:

1. An input device comprising:
    an operation member;
    an actuator configured to impart a tactile effect to the operation member; and
    a controller configured to apply, to the actuator, a control signal for starting to apply a first vibration to the operation member at a first timing and for starting to apply a second vibration to the operation member at a second timing after the first timing, such that a combined vibration of the first vibration and the second vibration is applied to the operation member,
    wherein the controller is configured to change a duration of a first period of the combined vibration to two or more different durations of the first period by changing a control period of time that is defined by a time lapse from the first timing to the second timing to two or more different control periods of time and applying the second vibration to the operation member before a first peak of the first vibration.

2. The input device according to claim 1, wherein the controller is configured to apply the first vibration to the operation member by increasing a voltage applied to the actuator at the first timing and apply the second vibration by decreasing the voltage applied to the actuator at the second timing.

3. The input device according to claim 1, further comprising an elastic member configured to support mass of the operation member to form a spring-mass system.

4. The input device according to claim 3, wherein a frequency in the first period of the combined vibration is greater than or equal to a resonance frequency of the spring-mass system.

5. The input device according to claim 1, further comprising a sensor configured to detect a push operation on the operation member,
    wherein the controller applies the control signal to the actuator in response to detection of the push operation by the sensor.

6. The input device according to claim 5, wherein the actuator is configured to cause the operation member to vibrate in a direction substantially parallel to a direction of the push operation.

7. The input device according to claim 1, wherein a frequency in the first period of the combined vibration is greater than or equal to 100 Hz and less than or equal to 500 Hz.

8. The input device according to claim 1, wherein one or more different control periods of time, of the two or more different control periods of time, are each less than or equal to one half of a period of the first vibration.

9. The input device according to claim 1, wherein the actuator is a piezoelectric actuator, and
    the controller is configured to start to apply the first vibration by causing a voltage applied to the piezoelectric actuator to rise and configured to start to apply the second vibration by causing the voltage to fall.

10. The input device according to claim 1, wherein the actuator is a magnetic actuator, and
    the controller is configured to start to apply the first vibration by starting application of a current to the magnetic actuator and configured to start to apply the second vibration by stopping the application of the current to the magnetic actuator.

11. The input device according to claim 1, wherein the operation member includes an operation panel member, and
    wherein the operation panel member has a touch surface and is configured to detect coordinates of a touched position within the touch surface.

12. The input device according to claim 11, wherein the controller is configured to select the control period of time in accordance with the coordinates of the touched position.

13. The input device according to claim 11, further comprising a first sensor, a second sensor, and a third sensor,
    wherein the first sensor, the second sensor, and the third sensor are disposed on a reference plane spaced apart from the operation panel member, and are configured to detect respective distances to the operation panel member,
    wherein the controller is configured to process signals from the operation panel member, the first sensor, the second sensor, and the third sensor,
    wherein the operation panel member is tiltable relative to the reference plane in response to a load applied to the touched position, and
    wherein the controller is configured to calculate a displacement of the operation panel member occurring upon a touch operation at the touched position based on the coordinates of the touched position detected by the operation panel member and the respective distances detected by the first sensor, the second sensor, and the third sensor.

14. The input device according to claim 13, wherein the first sensor is configured to detect a distance between the first sensor and a first point on the operation panel member,
    wherein the second sensor is configured to detect a distance between the second sensor and a second point on the operation panel member,
    wherein the third sensor is configured to detect a distance between the third sensor and a third point on the operation panel member, and
    wherein the controller is configured to identify a plane that contains the first point, the second point, and the third point, and to identify coordinates within the plane corresponding to the coordinates of the touched position.

15. The input device according to claim 13, wherein a direction of the distances detected by the first sensor, the second sensor, and the third sensor is a first direction perpendicular to the reference plane.

16. The input device according to claim 13, wherein the operation panel member includes
    a touchpad, and
    a holder configured to hold the touchpad, and wherein the first sensor, the second sensor, and the third sensor are configured to detect distances to the holder.

17. The input device according to claim 13, wherein the first sensor, the second sensor, and the third sensor are photosensors.

18. The input device according to claim 1, wherein the controller is configured to select the control period of time in accordance with an input mode.

19. A control method for controlling an input device that includes an operation member and an actuator, the actuator being configured to impart a tactile effect to the operation member, the control method comprising:

applying, to the actuator, a control signal for starting to apply a first vibration to the operation member at a first timing and for starting to apply a second vibration to the operation member at a second timing after the first timing, such that a combined vibration of the first vibration and the second vibration is applied to the operation member; and changing a duration of a first period of the combined vibration to two or more different durations of the first period by changing a control period of time that is defined by a time lapse from the first timing to the second timing to two or more different control periods of time and applying the second vibration to the operation member before a first peak of the first vibration.

20. A non-transitory recording medium storing a program for causing a computer, of an input device that includes an operation member and an actuator configured to impart a tactile effect to the operation member, to execute a process comprising:

applying, to the actuator, a control signal for starting to apply a first vibration to the operation member at a first timing and for starting to apply a second vibration to the operation member at a second timing after the first timing, such that a combined vibration of the first vibration and the second vibration is applied to the operation member; and changing a duration of a first period of the combined vibration to two or more different durations of the first period by changing a control period of time that is defined by a time lapse from the first timing to the second timing to two or more different control periods of time and applying the second vibration to the operation member before a first peak of the first vibration.

* * * * *